United States Patent
Harris et al.

(10) Patent No.: US 8,855,584 B2
(45) Date of Patent: Oct. 7, 2014

(54) MATCHING NETWORK FOR TRANSMISSION CIRCUITRY

(71) Applicant: Cree, Inc., Durham, NC (US)

(72) Inventors: Christopher Harris, Taby (SE); Raymond S. Pengelly, Hillsborough, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 14/077,515

(22) Filed: Nov. 12, 2013

(65) Prior Publication Data

US 2014/0065991 A1    Mar. 6, 2014

Related U.S. Application Data

(62) Division of application No. 12/917,112, filed on Nov. 1, 2010, now Pat. No. 8,611,834.

(51) Int. Cl.
| | | |
|---|---|---|
| H04B 1/04 | (2006.01) | |
| H03C 1/52 | (2006.01) | |
| H03H 7/38 | (2006.01) | |
| H03F 1/56 | (2006.01) | |
| H03F 3/24 | (2006.01) | |
| H03H 7/40 | (2006.01) | |
| H03F 1/02 | (2006.01) | |

(52) U.S. Cl.
CPC . *H03H 7/38* (2013.01); *H03F 1/56* (2013.01); *H03F 3/24* (2013.01); *H03H 7/40* (2013.01); *H04B 1/0458* (2013.01); *H03F 1/0288* (2013.01); *H03F 2200/222* (2013.01); *H03F 2200/378* (2013.01); *H03F 2200/387* (2013.01)
USPC ...................................... 455/114.1; 455/107

(58) Field of Classification Search
USPC ............ 455/107, 114.1, 114.2, 120, 125, 126
See application file for complete search history.

(56) References Cited

U.S. PATENT DOCUMENTS

| 5,880,635 A | 3/1999 | Satoh |
| 6,020,787 A | 2/2000 | Kim et al. |

(Continued)

FOREIGN PATENT DOCUMENTS

| EP | 0637131 A1 | 7/1994 |
| EP | 1605589 A1 | 12/2005 |
| WO | 2008014029 A2 | 1/2008 |

OTHER PUBLICATIONS

Wang, Feipeng et al., "Envelope Tracking Power Amplifier with Pre-Distortion Linearization for WLAN 802.11g," 2004 IEEE MTT-S Digest, Jun. 6-11, 2004, pp. 1543-1546.

(Continued)

*Primary Examiner* — Nguyen Vo
(74) *Attorney, Agent, or Firm* — Withrow & Terranova, P.L.L.C.

(57) ABSTRACT

The present disclosure relates to transmission circuitry of a wireless communication device. The transmission circuitry includes power amplifier circuitry, an output matching network, and impedance control circuitry. The power amplifier circuitry amplifies a radio frequency (RF) input signal to provide an amplified RF output signal, which is passed through the output matching network and transmitted via one or more antennas. As the center frequency of the RF input signal and conditions of operating parameters change, the impedance control circuitry adjusts the values of one or more variable impedance elements of the output matching network in a desired fashion. The values of the variable impedance elements are adjusted such that the output matching network concurrently and dynamically presents the desired load impedances at the center frequency and at one or more harmonics of the RF input signal to achieve a given performance specification.

3 Claims, 13 Drawing Sheets

(56) References Cited

U.S. PATENT DOCUMENTS

| | | |
|---|---|---|
| 6,349,216 B1 | 2/2002 | Alberth, Jr. et al. |
| 6,700,444 B2 | 3/2004 | Pengelly |
| 6,737,922 B2 | 5/2004 | Pengelly et al. |
| 6,782,244 B2 * | 8/2004 | Steel et al. ............. 455/127.1 |
| 6,791,417 B2 | 9/2004 | Pengelly et al. |
| 7,193,473 B2 | 3/2007 | Pengelly et al. |
| 7,428,230 B2 | 9/2008 | Park |
| 7,764,120 B2 | 7/2010 | Pengelly |
| 8,095,085 B2 | 1/2012 | Song et al. |
| 8,170,505 B2 | 5/2012 | Keerti et al. |
| 2003/0076174 A1 | 4/2003 | Tanoue et al. |
| 2003/0199256 A1 | 10/2003 | Klomsdorf et al. |
| 2008/0026709 A1 * | 1/2008 | Liu et al. ..................... 455/121 |
| 2010/0099369 A1 | 4/2010 | Ozgun et al. |
| 2011/0070848 A1 * | 3/2011 | Ramachandra Reddy . 455/127.2 |

OTHER PUBLICATIONS

International Search Report and Written Opinion for PCT/US2011/058384 mailed Feb. 3, 2012, 12 pages.
International Preliminary Report on Patentability for PCT/US2011/058384, mailed May 16, 2013, 8 pages.
Restriction Requirement for U.S. Appl. No. 12/917,112, mailed Feb. 26, 2013, 6 pages.
Non-Final Office Action for U.S. Appl. No. 12/917,112, mailed Apr. 19, 2013, 9 pages.
Notice of Allowance for U.S. Appl. No. 12/917,112, mailed Aug. 9, 2013, 8 pages.
First Office Action for Chinese Patent Application No. 201180052821.4 mailed Jun. 3, 2014, 16 pages.

* cited by examiner

MATCHING NETWORK FOR TRANSMISSION CIRCUITRY

RELATED APPLICATION

The present application is a divisional application under 35 U.S.C. §121 of U.S. application Ser. No. 12/917,112, entitled MATCHING NETWORK FOR TRANSMISSION CIRCUITRY, which was filed on Nov. 1, 2010, now U.S. Pat. No. 8,611,834, the disclosure of which is hereby incorporated herein in its entirety by reference.

FIELD OF THE DISCLOSURE

The present disclosure relates to wireless communications and in particular to dynamically controlling a variable matching network of a transmission path to provide desired impedances at a center frequency of a radio frequency (RF) input signal as well as at one or more harmonics of a center frequency for an RF input signal as operating conditions change.

BACKGROUND

In wireless communication systems, designers are constantly forced to make compromises between competing performance parameters when designing a transmission path for a communication device, such as a mobile device or a base station. With reference to FIG. 1, a typical transmission path for a wireless communication device is illustrated. The transmission path generally includes control and modulation circuitry 10 for encoding data to be transmitted via a modulated RF input signal $RF_{IN}$; power amplifier circuitry (PA) 12 for amplifying the modulated RF input signal $RF_{IN}$; an impedance matching network 14, which will be described below in further detail; and an antenna 16 for transmitting a modulated and amplified RF output signal $RF_{OUT}$ to a remote device. In almost any transmission path design, designers are forced to make tradeoffs between the normally competing parameters of efficiency and linearity. To minimize power consumption and heat generation, maximizing efficiency is imperative. To maximize the quality of the transmitted signal, maintaining linearity is often imperative.

Unfortunately, the more accurate transmission path designs are generally less efficient. While linearity and efficiency are important in transmission path design, other parameters, such as the effective operating frequency range (i.e., bandwidth) and signal gain, are also important to the overall design and tend to compete with one another. Different designers may weigh these various parameters differently. For example, the efficiency and bandwidth of the transmission path may take precedence over linearity in a mobile device, while linearity may take precedence over efficiency and bandwidth in a base station. Further, one designer of a particular type of communication device may have different priorities for the various parameters than another designer based on the particular application or price point for the communication device.

Notably, the operating frequency, output power, and type of modulation scheme provided by a communication device all significantly impact performance. For example, power amplifier circuitry 12 that employs a given type of amplifier may be relatively efficient within a first bandwidth of operation or first output power range, but may be relatively inefficient in a second bandwidth of operation or second output power range. Similarly, the same power amplifier circuitry 12 may be relatively efficient at amplifying a signal that was modulated using one modulation scheme, but may be relatively inefficient at amplifying a signal that was modulated using a second modulation scheme. These conflicting design parameters are most problematic with communication devices that employ different modulation schemes, support different or wide bandwidths of operation, and need to operate over a wide range of output power levels. In essence, there are no amplifier designs that remain highly efficient at different power levels while operating over wide bandwidths and on signals that were modulated with different modulation schemes. As a result, designers are developing techniques to dynamically change the configuration of various aspects of the transmission path based on characteristics of the RF input signal $RF_{IN}$ in an effort to improve overall system performance.

One aspect of the transmission path that is being dynamically configured during operation is the actual impedance of the impedance matching network 14. As illustrated FIG. 1, the impedance matching network 14 resides between the power amplifier circuitry 12 and the antenna 16 and is generally used to match the output impedance of the power amplifier circuitry 12 with the load impedance presented by the antenna 16. In theory, matching the output impedance of the power amplifier circuitry 12 with the load impedance presented by the antenna 16 results in maximum power transfer from the power amplifier circuitry 12 to the antenna 16. In practice however, such theoretical matching is at best approximated because the impedance matching network 14 also impacts many operating parameters of the power amplifier circuitry 12. For instance, the impedance of the effective load presented to the power amplifier circuitry 12 may greatly affect the linearity, output power, and efficiency of the power amplifier circuitry 12, and as such, the effective load presented to the power amplifier circuitry 12 may be more critical than perfectly matching the output impedance of the power amplifier circuitry 12 to the load impedance presented by the antenna 16.

As such, the impedance of the impedance matching network 14 may be dynamically adjusted during operation based on characteristics of the RF input signal $RF_{IN}$, such as the center frequency, amplitude, the modulation of the RF input signal $RF_{IN}$, and the desired output power. As illustrated in FIGS. 2 and 3, impedance control circuitry 18 may be added to the transmission path and used to dynamically adjust the variable impedance of the impedance matching network 14 based on characteristics of the RF input signal $RF_{IN}$ during operation and the desired output power. For the transmission path illustrated in FIG. 2, the impedance control circuitry 18 is configured to receive and analyze the RF input signal $RF_{IN}$, and based on analyzed characteristics of the RF input signal $RF_{IN}$ and the desired output power, dynamically adjust the impedance of the impedance control circuitry 18 in a defined manner using an impedance control signal $S_{ZC}$. For example, the impedance control circuitry 18 could continuously adjust one or more variable impedance elements of the impedance matching network 14 based on the amplitude and center frequency of the RF input signal $RF_{IN}$.

The transmission path is designed to support multiple channels where each channel is generally associated with a different center frequency. For each center frequency, or channel, the impedance control circuitry 18 may include a number of control values that correspond to the different possible amplitude values of the RF input signal $RF_{IN}$ and the different available output power levels. In operation, the impedance control circuitry 18 will continuously identify a control value based on the center frequency and amplitude of the RF input signal $RF_{IN}$ and the selected output power level and generate a corresponding impedance control signal $S_{ZC}$, which is used to adjust the impedance matching network 14 to provide the desired impedance for the given center frequency and amplitude of the RF input signal $RF_{IN}$ and the desired output power level.

For the transmission path illustrated in FIG. 3, the control and modulation circuitry 10 is configured to present to the impedance control circuitry 18 a parameter signal $S_P$ that provides information bearing on one or more characteristics of the RF input signal $RF_{IN}$, which is concurrently being presented to the power amplifier circuitry 12 for amplification. Based on the parameter signal $S_P$, the impedance control circuitry 18 will generate a corresponding impedance control signal $S_{ZC}$ to adjust the impedance matching network 14 to provide the desired impedance for the given center frequency and amplitude of the RF input signal $RF_{IN}$ and the selected output power level. With the embodiment in FIG. 3, the impedance control circuitry 18 does not need to analyze the actual RF input signal $RF_{IN}$, as provided the embodiment of FIG. 2. Instead, the impedance control circuitry 18 only needs to determine the appropriate impedance to select based on the parameter signal $S_P$ and provide an appropriate impedance control signal $S_{ZC}$ to the impedance matching network 14.

Existing transmission path designs that employ modulated impedances that are presented to the power amplifier circuitry 12 focus on impedances at the center frequency of the RF input signal $RF_{IN}$. The impedances at the various harmonics of the RF input signal $RF_{IN}$ have been ignored. As a highly simplified example, assume that the transmission path is used to transmit a first signal at a first center frequency $f_1^C$ and a second signal at a second center frequency $f_2^C$. The first center frequency $f_1^C$ and the second center frequency $f_2^C$ are at different frequencies in different defined bandwidths of operation. Further assume that to meet desired performance specifications, designers have determined that the impedance matching network 14 should "ideally" provide a first impedance $z_1^C$ when the RF input signal $RF_{IN}$ is provided at the first center frequency $f_1^c$ and provide a second impedance $z_2^C$ when the RF input signal $RF_{IN}$ is provided at the second center frequency $f_2^C$. In operation, the impedance control circuitry 18 will adjust the impedance matching network 14 to provide the first impedance $z_1^C$ when the RF input signal $RF_{IN}$ is at the first center frequency $f_1^C$ and $f_2^C$, provide the second impedance $z_2^C$ when the RF input signal $RF_{IN}$ is at the second center frequency $f_2^C$. With reference to FIG. 4, the respective impedances $z_1^C$ and $z_2^C$, which are provided at the first and second center frequencies $f_1^C$ and $f_2^C$, are illustrated as impedance points ($f_1^C$ and $f_2^C$) on a Smith chart.

As noted, existing load switching designs fail to take into consideration the impedances at the harmonics of the center frequencies of operation. However, applicants have discovered that the impedances at the harmonics of the center frequencies significantly impact the performance of the power amplifier circuitry 12 in particular and the transmission path in general. To meet a given performance specification, applicants have discovered that for any given operating condition, there are "ideal" impedances for the harmonics of the center frequencies in addition to an "ideal" impedance for the center frequency of an RF input signal $RF_{IN}$. These "ideal" impedances for the given operating conditions may vary based on the desired performance specification for a particular design.

Continuing with the prior example, assume that designers determined that the impedance matching network 14 should "ideally" provide the first impedance $z_1^C$ when the RF input signal $RF_{IN}$ is provided at the first center frequency $f_1^C$ and provide the second impedance $z_2^C$ when the RF input signal $RF_{IN}$ is provided at the second center frequency $f_2^C$. Again, the impedance control circuitry 18 will adjust the impedance matching network 14 to provide the first impedance $z_1^C$ when the RF input signal $RF_{IN}$ is at the first center frequency $f_1^C$ and provide the second impedance $z_2^C$ when the RF input signal $RF_{IN}$ is at the second center frequency $f_2^C$. With reference to FIG. 5, the respective impedances $z_1^C$ and $z_2^C$, which are provided at the first and second center frequencies $f_1^C$ and $f_2^C$, are illustrated as impedance points ($f_1^C$ and $f_2^C$) on a Smith chart.

If only the impedances at the first and second center frequencies $f_1^C$ and $f_2^C$ are considered when designing the impedance matching network 14, applicants have discovered that the actual impedance points for the harmonics associated with the first and second center frequencies $f_1^C$ and $f_2^C$ may differ significantly from what would be considered the "ideal" impedance points for the respective harmonics. The result is compromised performance. With continued reference to the Smith chart of FIG. 5, assume that the actual impedance points for the second and third harmonics $f_1^{2H}$ and $f_1^{3H}$ associated with the first center frequency $f_1^C$ and the second and third harmonics $f_2^{2H}$ and $f_2^{3H}$ associated with the second center frequency $f_2^C$ are not considered "ideal" and are provided as a result of only considering the impedances at the first and second center frequencies $f_1^C$ and $f_2^C$ of operation. As illustrated by circles on the Smith chart, exemplary "ideal" impedance points or ranges ($f_1^{2H(IDEAL)}$, $f_1^{3H(IDEAL)}$, $f_2^{2H(IDEAL)}$, and $f_2^{3H(IDEAL)}$) for the second and third harmonics $f_1^{2H}$ and $f_1^{3H}$ associated with the first center frequency $f_1^C$ and the second and third harmonics $f_2^{2H}$ and $f_2^{3H}$ of the second center frequency $f_2^C$ are illustrated. As one can see, the differences between the actual impedances and the desired impedances for the different harmonics vary greatly.

While the impedances at the center frequencies of operation may be considered "ideal" for the given performance specification, the transmission path could perform significantly better if the impedance matching network 14 were configured and controlled to provide the "ideal" impedances at the center frequency and at least one of the harmonics associated with the center frequency for any given RF input signal $RF_{IN}$, as illustrated in FIG. 6. In this example, for an RF input signal $RF_{IN}$ at the first center frequency $f_1^C$, the impedance matching network 14 would preferably provide "ideal" impedances at the first center frequency $f_1^C$ as well as the second and third harmonics $f_1^{2H(IDEAL)}$ and $f_1^{3H(IDEAL)}$ associated with the first center frequency $f_1^C$. For an RF input signal $RF_{IN}$ at the second center frequency $f_1^C$, the impedance matching network 14 would preferably provide "ideal" impedances at the second center frequency $f_2^C$ as well as the second and third harmonics $f_2^{2H(IDEAL)}$ and $f_2^{3H(IDEAL)}$ associated with the second center frequency $f_2^C$.

Accordingly, there is a need to dynamically control the impedance matching network of a transmission path to provide desired impedances at one or more of the harmonics associated with the center frequency of an RF input signal in addition to providing a desired impedance at the center frequency of the RF input signal.

SUMMARY

One aspect of the present disclosure relates to transmit circuitry of a wireless communication device. The transmit circuitry includes power amplifier circuitry, an output matching network, and impedance control circuitry. The power amplifier circuitry amplifies an RF input signal to provide an amplified RF output signal, which is passed through the output matching network and transmitted via one or more antennas. The output matching network includes variable impedance elements, which may include one or more variable capacitors, inductors, and resistors, which are controlled by the impedance control circuitry. As the center frequency of the RF input signal and conditions of the operating parameters change, the impedance control circuitry adjusts the values of one or more of the variable impedance elements of the output matching network in a desired fashion. The values of the variable impedance elements are adjusted such that the output matching network concurrently and dynamically presents the desired load impedances at the center frequency and at one or more harmonics of the RF input signal to achieve a given performance specification.

Notably, those skilled in the art will appreciate that the center frequency and harmonics of a given RF input signal are effectively the same as the corresponding amplified RF input signal or RF output signal. As such, setting impedances or values of impedance elements based on the center frequency and one or more harmonics of the RF input signal functions to set these impedances or values based on the same center frequency and harmonics of the RF output signal. Reference to the center or harmonic frequencies to the RF input signal is simply to clarify the values of the frequencies themselves, not to attribute a source from which information bearing on these frequencies is derived for processing. Further, the noted operating parameters may include a desired output power, amplitude, or phase of the RF input signal, mode of operation, and the like. The mode of operation may relate to the type of modulation used to generate the RF input signal, a frequency band of operation, or a combination thereof.

For example, assume that the impedances at the center frequency, the second harmonic, and the third impedance of the RF input signal are specifically controlled during operation. Further assume that there are n different center frequencies at which the RF input signal may be centered. For a given center frequency of the RF input signal and a given set of operating parameter conditions, there are desired impedances of the output matching network at the center frequency, the second harmonic, and the third harmonic of the RF input signal. As the center frequency of the RF input signal or any of the operating parameter conditions change, the values of the variable impedance elements of the output matching network are adjusted as necessary to ensure that the output matching network presents the desired impedances at each of the center frequency, the second harmonic, and the third harmonic of the RF input signal to the output of the power amplifier circuitry. At any given time, the respective impedances at the center frequency, the second harmonic, and the third harmonic of the RF input signal will likely be different and determined in an effort to achieve a given performance specification based on the current center frequency and operating parameter conditions.

In one configuration, the impedances presented to the power amplifier circuitry at each of the available center frequencies of the RF input signal are configured to pass the center frequency of the RF input signal. In contrast, the impedances at each of the second and third harmonics for each of the available center frequencies are configured to reflect the respective harmonics back toward the power amplifier circuitry. When the second and third harmonics are reflected at particular phases, efficiency is optimized.

Notably, the conditions for some operating conditions may change while others may remain relatively static during a given transmission period. For those operation parameters that are subject to change, the rate of change may vary greatly. With the above example, the amplitude of the RF input signal may change substantially constantly for modulation schemes where the amplitude of the RF input signal is modulated. In contrast, the desired output power may change, but will generally change much less frequently than the amplitude of the RF input signal. In certain communication schemes, the center frequency of the RF input signal and the type of modulation may stay relatively static, while in other communication schemes, the center frequency may change frequently.

To determine how to control the values of the one or more impedance elements for different center frequencies and operating parameters, the impedance control circuitry may include one or more lookup tables. For each combination of operating parameter conditions and available center frequencies for the RF input signal, one or more lookup tables will store control information, which is used to adjust the values of one or more of the variable impedance elements of the output matching network, such that the output matching network dynamically presents the desired load impedances at the center frequency and at one or more harmonics of the RF input signal to achieve the given performance specification. In essence, the control information in the lookup table is effectively a function of the center frequency of the RF input signal being amplified and at least one operating parameter.

In particular, each entry in the lookup table provides impedance control data for the possible combinations of operating parameter conditions and center frequencies. For example, assume that the pertinent operating parameters that dictate the load impedances presented to the output of the amplifier circuitry are the center frequency of the RF input signal, the amplitude of the RF input signal, the desired output power, and the type of modulation used to generate the RF input signal. As such, the impedance control data for each lookup table entry corresponds to a unique combination of an available center frequency, an available amplitude of the RF input signal, an available output power level, and an available type of modulation. During operation, the impedance control circuitry will substantially continuously monitor the current center frequency of the RF input signal, the amplitude of the RF input signal, the desired output power level, and the type of modulation used to generate the RF input signal and select the impedance control data from the lookup table entry that corresponds to the center frequency of the RF input signal and the current operating parameter conditions. The impedance control data from the selected lookup table entry is used to set the values of one or more of the impedance elements such that the output matching network dynamically presents the desired load impedances at the center frequency and at one or more harmonics of the RF input signal for current operating parameter conditions.

As an alternative to lookup tables, the impedance control circuitry may employ one or more algorithms to dynamically calculate the impedance control data for a given center frequency and set of operating parameter conditions. The algorithms are effectively a function of the center frequency of the RF input signal being amplified and one or more operating parameters. The algorithms are designed to generate impedance control data that will set the values of one or more of the impedance elements to provide the desired load impedances at the center frequency and at one or more harmonics of the RF input signal for various combinations of center frequencies and operating parameter conditions.

Another aspect of the present disclosure relates to providing an input matching network in front of the power amplifier circuitry. The input matching network includes variable impedance elements, which are also controlled by the impedance control circuitry in essentially the same manner the output matching network is controlled. As the center frequency of the RF input signal and conditions of the operating parameters change, the impedance control circuitry adjusts the values of one or more of the variable impedance elements of the input matching network in a desired fashion. The values of the variable impedance elements are adjusted such that the input matching network concurrently and dynamically presents the desired impedances at the center frequency and at one or more harmonics of the RF input signal to achieve a given performance specification. Notably, the input and output matching networks will generally be different and will play different roles in achieving the given performance specification. Accordingly, the impedances presented at any given time at the source and load of the power amplifier circuitry will likely differ at the center frequency, the second harmonic, and the third harmonic of the RF input signal.

The variable input and output matching networks are beneficial with virtually any type of power amplifier design. For single path amplifier designs, the input and output matching networks may be placed before and after the power amplifier circuitry. For parallel path amplifier designs, such as those employing a Doherty amplifier configuration, input and output matching networks may be provided before and after the power amplifier circuitry in each of the parallel paths. Regardless of the amplifier design, employing an output matching network according to the current disclosure may provide up to a fifty percent (50%) improvement in efficiency over existing designs. Employing an input matching network according to the present disclosure in addition to the disclosed output matching network has proven to provide incremental, yet significant, efficiency gains on top of those provided by incorporating only the output matching network.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
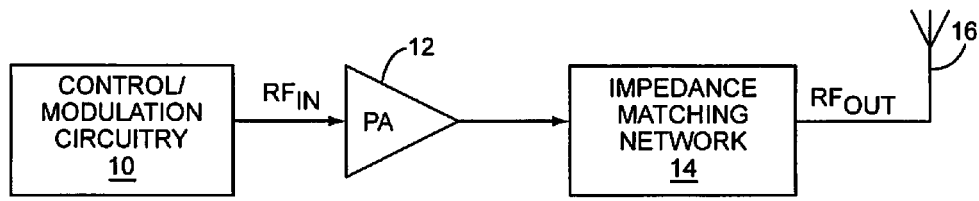
FIG. 1 illustrates transmission circuitry according to a first embodiment of related art.
Figure 2:
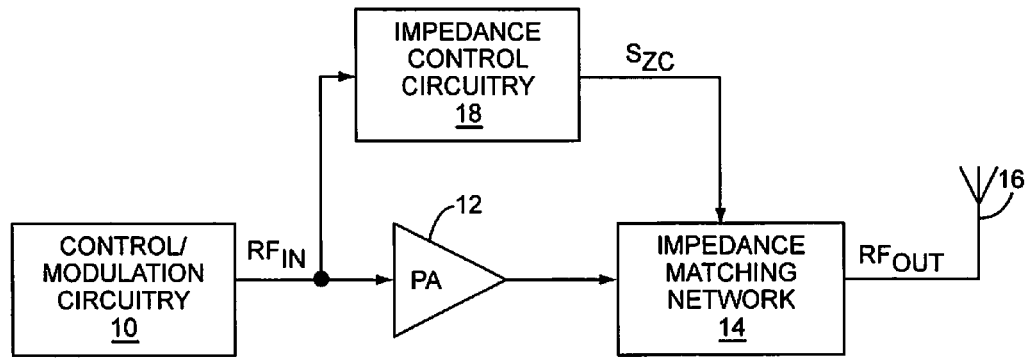
FIG. 2 illustrates transmission circuitry according to a second embodiment of related art.
Figure 3:
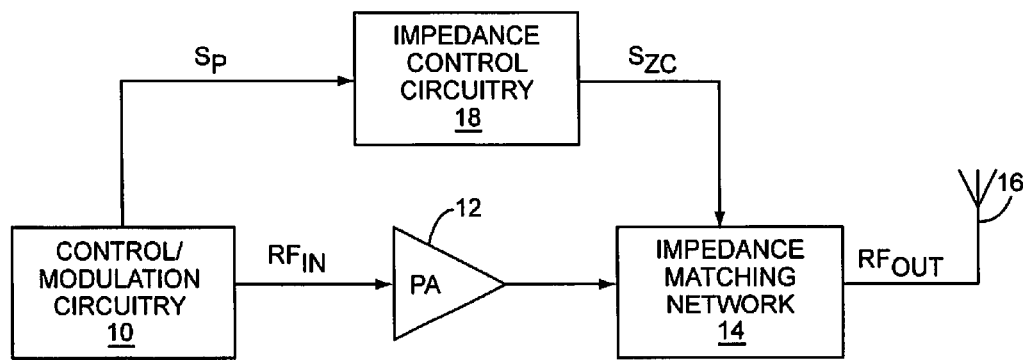
FIG. 3 illustrates transmission circuitry according to a third embodiment of related art.
Figure 4:
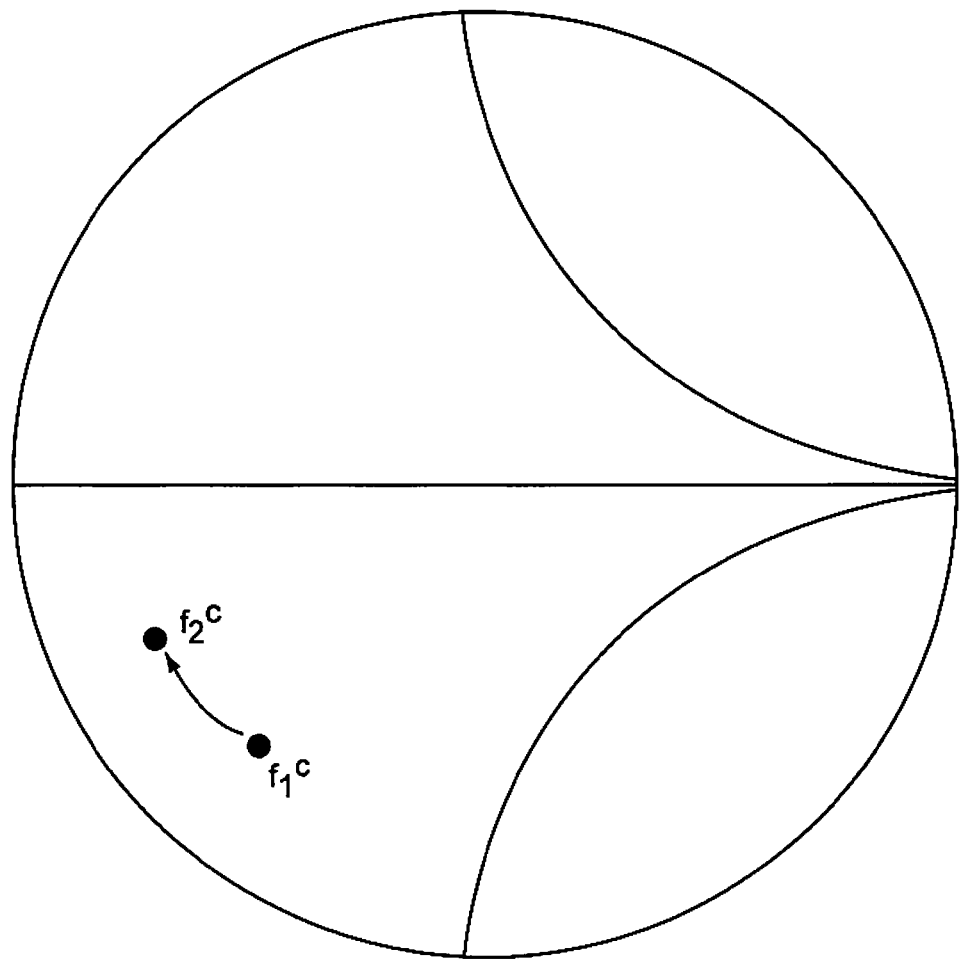
FIG. 4 is a Smith chart illustrating impedance points at two different center frequencies.
Figure 5:
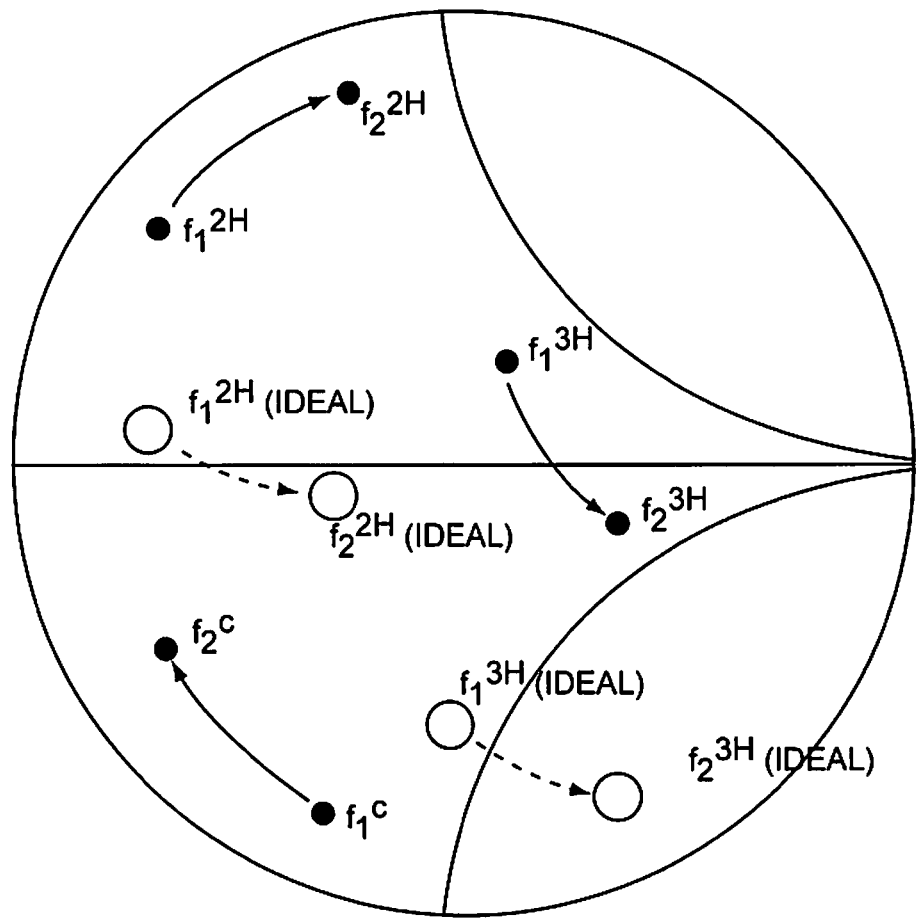
FIG. 5 is a Smith chart illustrating impedance points at various center frequencies and their associated harmonics, wherein the impedance points for the harmonics are not ideally situated.
Figure 6:
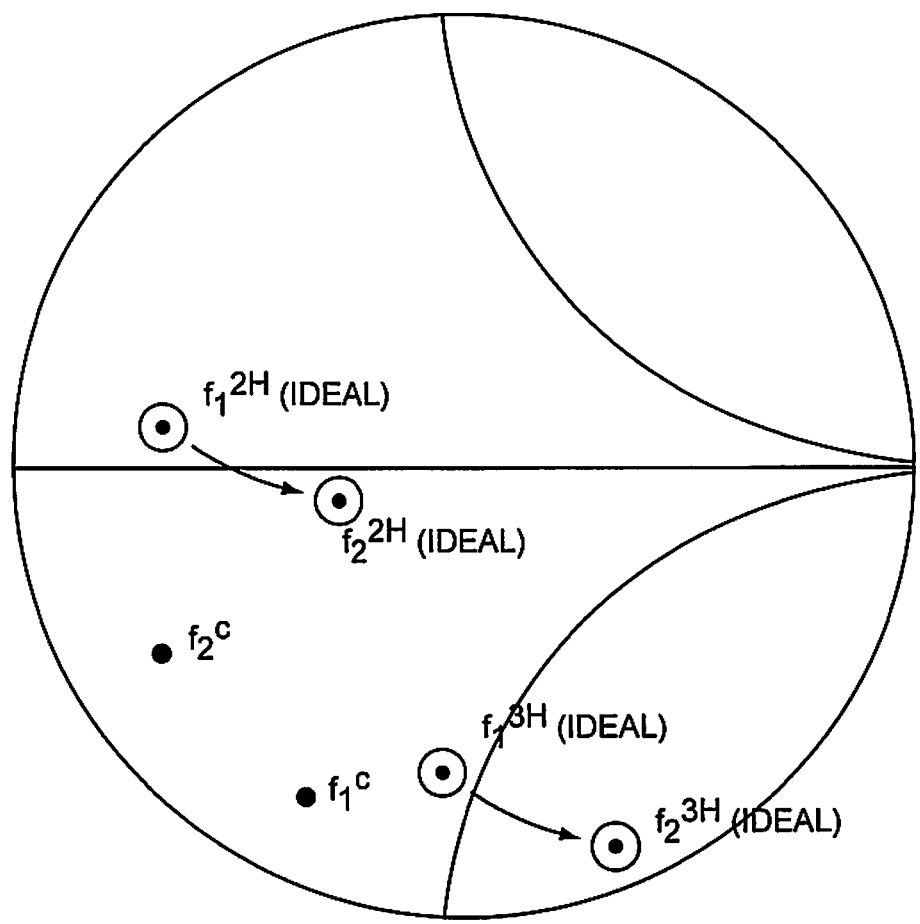
FIG. 6 is a Smith chart illustrating impedance points at various center frequencies and their associated harmonics, wherein the impedance points for the harmonics are ideally situated.
Figure 7:
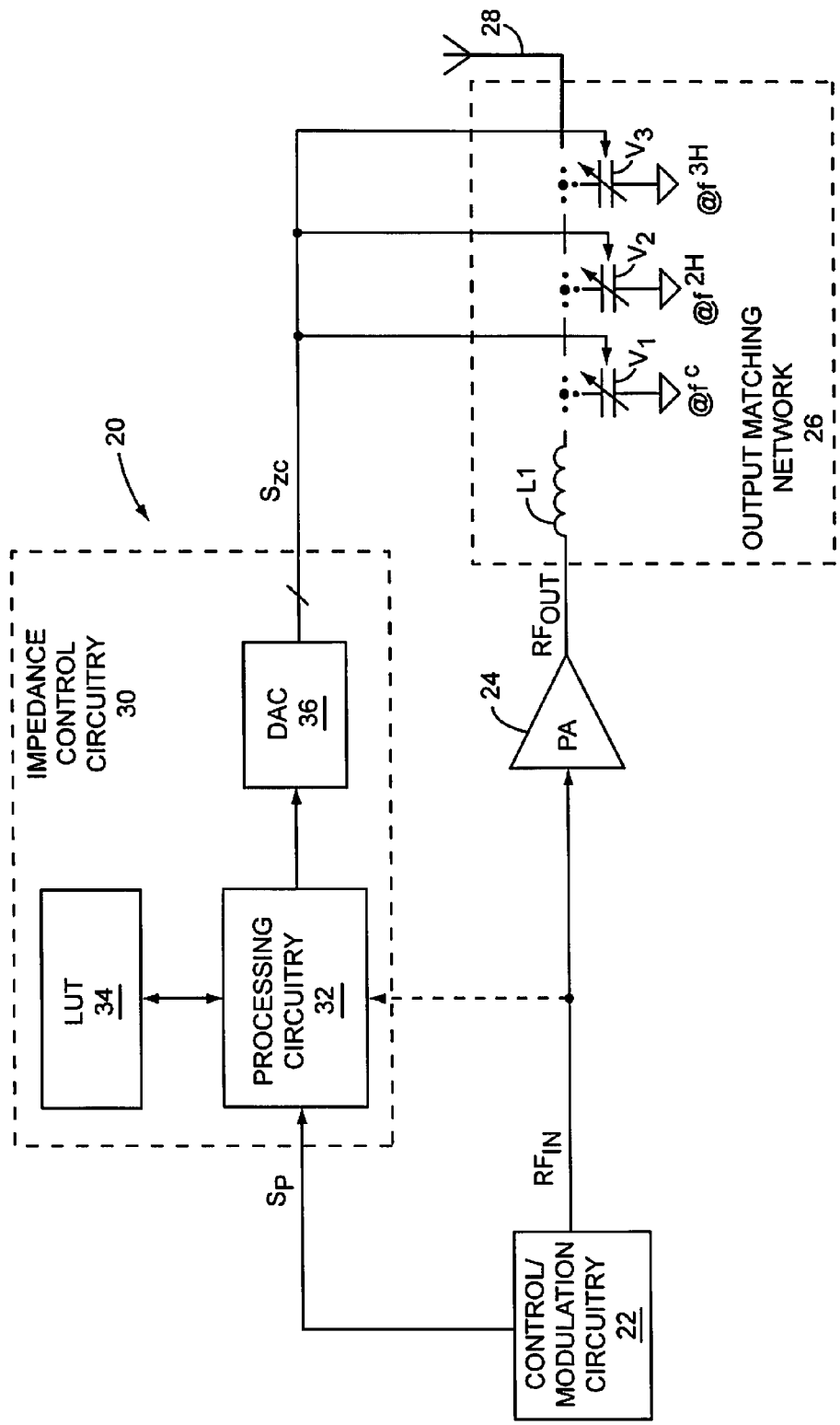
FIG. 7 illustrates transmission circuitry having an output matching network.

With reference to FIG. 7, transmission circuitry 20 is illustrated according to a first embodiment of the disclosure. The transmission circuitry 20 includes control and modulation circuitry 22, power amplifier circuitry (PA) 24, an output matching network 26, an antenna 28, and impedance control circuitry 30. The control and modulation circuitry 22 may represent separate or integrated control and modulation architectures. Regardless of implementation, the control and modulation circuitry 22 provides the overall control of the transmission circuitry 20 as well as modulating baseband data according to a selected modulation scheme to provide a modulated radio frequency (RF) input signal $RF_{IN}$. Exemplary modulation schemes may include, but are not limited to, phase shift keying (PSK), frequency shift keying (FSK), amplitude shift keying (ASK), quadrature amplitude modulation (QAM), continuous phase modulation (CPM), orthogonal frequency division modulation (OFDM), spread spectrum modulation, and any variants thereof. As those skilled in the art will appreciate, various modulation schemes may be employed in different multiple access techniques, such as time division multiple access (TDMA), code division multiple access (COMA), frequency division multiple access (FDMA), and orthogonal frequency division multiple access (OFDMA) techniques, to support wireless communications. These modulation schemes and multiple access techniques support current and next generation wireless communication standards for voice and data communications. These standards include, but are not limited to CDMA One/2000, Global System for Mobile Communications (GSM), Personal Communication Service (PCS), Universal Mobile Telecommunications Systems (UMTS), Worldwide Interoperability for Microwave Access (WiMAX), Long Term Evolution (LTE), and the like.

The power amplifier circuitry 24 is configured to amplify the RF input signal $RF_{IN}$ to provide an amplified RF output signal $RF_{OUT}$ at a desired power level. The power amplifier circuitry 24 may employ virtually any type of power amplifier design and may be set to operate according to different amplifier classes, such as class A, B, A/B, C, D, E, F, G, H, J, T, and the like, depending on the given performance requirements and design of the transmission circuitry 20.

The output matching network 26 provides a variable impedance network and resides between the power amplifier circuitry 24 and the antenna 28. A number of static and variable impedance elements may be used to form the variable impedance network of the output matching network 26. The variable impedance network may take the form of a resistive-capacitive (RC), inductive-capacitive (LC), or resistive-inductive-capacitive (RLC) network. The impedance elements of the variable impedance network may include inductive, capacitive, and resistive elements, such as inductors, capacitors, and resistors, respectively, or appropriate equivalents. For example, a variable capacitor is generally referred to as a varactor. As illustrated, a portion of the output matching network 26 is shown to include an inductor L1 and three varactors $V_1$, $V_2$, and $V_3$. The three varactors $V_1$, $V_2$, and $V_3$ are depicted simply to represent the output matching network's 26 ability to be dynamically tuned to present desired impedances for each of the center frequency and one or more harmonics of different RF input signals $RF_{IN}$. As illustrated, the output matching network 26 can be dynamically tuned to present desired impedances for each of the center frequency $f^C$, the second harmonic $f^{2H}$, and the third harmonic $f^{3H}$ of the current RF input signals $RF_{IN}$.

The varactors $V_1$, $V_2$, and $V_3$ are illustrated as being controlled by the impedance control circuitry 30 using one or more impedance control signals $S_{ZC}$. In the illustrated embodiment, each of the varactors $V_1$, $V_2$, and $V_3$ receive a unique impedance control signal $S_{ZC}$. Notably, a given output matching network 26 may include any number of variable impedance elements, which are controlled by the impedance control circuitry 30. Exemplary configurations for the output matching network 26 are described later in association with FIGS. 12 and 13.

During operation, the center frequency of the RF input signals $RF_{IN}$ may change as communication channels or modes of operation change. Further, the conditions of various operating parameters under which the transmission circuitry 20 operates may also change. Exemplary operating parameters may include the desired output power, amplitude or phase of the RF input signal $RF_{IN}$, mode of operation, and the like. The mode of operation may relate to the type of modulation used to generate the RF input signal $RF_{IN}$, a frequency band of operation, or a combination thereof. Changes in the conditions of the these operating parameters may correspond to increasing or decreasing the desired output power, changes in the amplitude of the phase components of the RF input signal $RF_{IN}$, or a switch from one mode of operation to another. The listed modes of operation and condition changes are merely exemplary and are not exhaustive.

As the center frequency of the RF input signals $RF_{IN}$ and the conditions of the operating parameters change, the respective impedances that are presented to the power amplifier circuitry 24 at the center frequency and one or more harmonics of the RF input signal $RF_{IN}$ may also need to change to maintain a minimum performance criteria, which is generally referred to as a given performance specification. Accordingly, as the center frequency of the RF input signal $RF_{IN}$ and conditions of the operating parameters change, the impedance control circuitry 30 dynamically adjusts the values of one or more of the variable impedance elements of the output matching network 26 in a desired fashion. The values of the variable impedance elements are adjusted such that the output matching network 26 concurrently and substantially continuously presents the desired load impedances at the center frequency and at one or more harmonics of the RF input signal $RF_{IN}$ to achieve the given performance specification. In effect, the values of the variable impedance elements, such as the varactors $V_1$, $V_2$, and $V_3$, are modulated in a desired fashion during operation by the impedance control circuitry 30. The given performance specification may set the minimum performance requirements for one or more metrics, such as linearity, efficiency, functional bandwidth, and power gain, in general or for specific operating conditions.

The impedance control circuitry 30 is configured to substantially continuously determine the relative values at which to set the variable impedance elements of the output matching network 26 in light of the current center frequency of the RF input signal $RF_{IN}$ and the conditions of the operating parameters. The current center frequency of the RF input signal $RF_{IN}$ and condition of the operating parameters may be provided by the control and modulation circuitry 22 via a parameter signal $S_P$, which may identify the current center frequency of the RF input signal $RF_{IN}$ and pertinent operating parameter conditions. For example, the parameter signal $S_P$ may present information bearing on one or more of the center frequency of the RF input signal $RF_{IN}$, the amplitude of the RF input signal $RF_{IN}$, the phase of the RF input signal $RF_{IN}$, the desired output power level, and the mode of operation. Further, processing circuitry 32 may also dynamically monitor the RF input signal $RF_{IN}$ to detect certain of these operating parameter conditions, such as center frequency, amplitude, or phase of the RF input signal $RF_{IN}$. In one embodiment, the processing circuitry 32 retrieves the current center frequency of the RF input signal $RF_{IN}$, the desired output power level, and the mode of operation from the parameter signal $S_P$. Any current amplitude or phase information of the RF input signal $RF_{IN}$ is determined in response to analyzing the RF input signal $RF_{IN}$.

Once the current center frequency of the RF input signal $RF_{IN}$ and the operating parameter conditions are obtained, the processing circuitry 32 determines the relative values at which to set the variable impedance elements of the output matching network 26 in light of the center frequency of the RF input signal $RF_{IN}$ and the current operating parameter conditions. To determine how to control the values of the variable impedance elements, the processing circuitry 32 will access one or more lookup tables (LUT) 34 based on the current center frequency and the operating parameter conditions. For each combination of available center frequencies for the RF input signal $RF_{IN}$ and operating parameter conditions, the lookup tables 34 will store control data. The control data is used to adjust the values of one or more of the variable impedance elements of the output matching network 26 such that the output matching network 26 continuously presents the desired load impedances at the center frequency and at one or more harmonics of the RF input signal $RF_{IN}$ to achieve the given performance specification.

For the embodiment of FIG. 7, the control data for each entry in the lookup table 34 corresponds to a specific center frequency and a specific combination of operating parameter conditions. The control data includes information sufficient to set the capacitance value of each of the three varactors $V_1$, $V_2$, and $V_3$ to the values best suited for the corresponding center frequency and operating parameter conditions. In particular, the control data for each of the three varactors $V_1$, $V_2$, and $V_3$ is sent to corresponding channels of a digital-to-analog converter (DAC) 36, which will generate corresponding analog impedance control signals $S_{ZC}$ to set the capacitance values of the respective varactors $V_1$, $V_2$, and $V_3$. As such, the capacitance values of the varactors $V_1$, $V_2$, and $V_3$ of the output matching network 26 are set based on the center frequency of the RF input signal $RF_{IN}$ and the pertinent operating parameter conditions. This process is substantially continuously repeated wherein the values of the variable impedance elements in the output matching network 26 are effectively modulated such that the power amplifier circuitry 24 is continuously presented with desired impedances at the center frequency and one or more harmonics of the RF input signal $RF_{IN}$.

For example, assume that the pertinent operating parameters that dictate the load impedances presented to the output of the power amplifier circuitry 24 are the center frequency of the RF input signal $RF_{IN}$, the amplitude of the RF input signal $RF_{IN}$, the desired output power, and the type of modulation used to generate the RF input signal $RF_{IN}$. The control data for each lookup table entry is predetermined and is effectively a function of an available center frequency of the RF input signal $RF_{IN}$, an available amplitude of the RF input signal $RF_{IN}$, an available output power level, and an available type of modulation. During operation, the impedance control circuitry 30 will substantially continuously monitor the current center frequency of the RF input signal $RF_{IN}$, the instantaneous amplitude of the RF input signal $RF_{IN}$, the desired output power level, and the type of modulation used to generate the RF input signal $RF_{IN}$. Based on the current center frequency of the RF input signal $RF_{IN}$ and the listed operating parameter conditions, the impedance control circuitry 30 will select the control data from the lookup table entry that corresponds to center frequency of the RF input signal $RF_{IN}$, the instantaneous amplitude of the RF input signal $RF_{IN}$, the desired output power level, and the type of modulation used to generate the RF input signal $RF_{IN}$. The selected control data is presented to the DAC 36, which provides corresponding impedance control signals $S_{ZC}$ to set the values of one or more of the impedance elements in the output matching network 26. As this process is repeated, the desired load impedances at the center frequency and at one or more harmonics of the RF input signal $RF_{IN}$ are substantially continuously varied in response to ever changing center frequencies and operating parameter conditions.

As an alternative to lookup tables 34, the impedance control circuitry 30 may employ one or more algorithms to dynamically calculate the control data in real time. The algorithms are effectively a function of the center frequency of the RF input signal $RF_{IN}$ being amplified and the pertinent operating parameters. As with the control data that populates the lookup tables 34, the control data generated via the algorithms is used to set the values of the variable impedance elements in the output matching network 26 as described above such that desired impedances are provided at the center frequency and one or more harmonics of the RF input signal $RF_{IN}$ in light of current operating parameter conditions.

The impedance values that are presented by the output matching network 26 to the power amplifier circuitry 24 at each possible center frequency and its associated harmonics over the varying operating parameter conditions are characterized in advance of operation through testing, experimentation, modeling, and the like. There is no magic set of impedance values, as different performance criteria will dictate different impedances values. However, for performance criteria that applies a certain weighting or relative priority for one or more of linearity, efficiency, power gain, and bandwidth, careful selection of the impedances at the harmonics of the RF input signal $RF_{IN}$, in addition to careful selection of an impedance at the center frequency of the RF input signal $RF_{IN}$, will provide significant performance gains over merely controlling the impedance at the center frequency of the RF input signal $RF_{IN}$. Once the impedances are characterized, the output matching network 26 is designed or synthesized with sufficient variability to present the requisite impedances at the center frequency and selected harmonics for each available combination of center frequency and operating parameter conditions. Next, the impedance control circuitry 30 is configured with the appropriate lookup table 34 or algorithm to control the output matching network 26 such that the desired impedances are provided at the center frequency and selected harmonics of the RF input signal $RF_{IN}$ in light of current center frequency and operating parameter conditions.

As an example, consider an embodiment where the impedances at the center frequency, the second harmonic, and the third harmonic of the RF input signal $RF_{IN}$ are controlled and efficiency is the primary emphasis in the given performance specification. In one configuration, the impedances presented to the power amplifier circuitry 24 at each of the available center frequencies of the RF input signal $RF_{IN}$ are configured to pass the center frequency of the RF input signal $RF_{IN}$. In contrast, the impedances at each of the second and third harmonics for each of the available center frequencies are configured to reflect the respective harmonics back toward the power amplifier circuitry 24. When the second and third harmonics are reflected at particular phases, efficiency is optimized. The particular phases will vary based on implementation. The reflected harmonics may be capacitively coupled from the output to the input of the power amplifier circuitry 24 through inherent feedback capacitance of the power amplifier circuitry 24. As a result, energy from the reflected harmonics will reinforce the RF input signal $RF_{IN}$ and thereby increase operating efficiency of the system. The nature of reinforcement has proven to significantly affect efficiency and other performance metrics.

Bandwidth may also be prioritized, without an undue penalty for efficiency and linearity. Applicants have shown that the impedances provided by the output impedance network 26 may be controlled in such a fashion to allow a single power amplifier of the power amplifier circuitry 24 to operate accurately and efficiently over extremely wide bandwidths and output power ranges. With appropriate output impedance modulation, a single power amplifier can accurately and efficiently amplify UMTS, PCS, WiMAX, and LTE signals. Since PCS operates around 1.8 gigahertz (GHz), UMTS operates between 2.11 and 2.17 GHz, WiMAX operates around 2.5 GHz, and LTE operates around 2.6 and 2.7 GHz, the bandwidth of operation for the single power amplifier is over 1 GHz. Efficiencies may approach 80% over average power ranges that could extend from 40 to 50 dBm. With class J (single path) amplifiers, bandwidths of 2 GHz may be realized at efficiencies as high as 65%.

Figure 8:
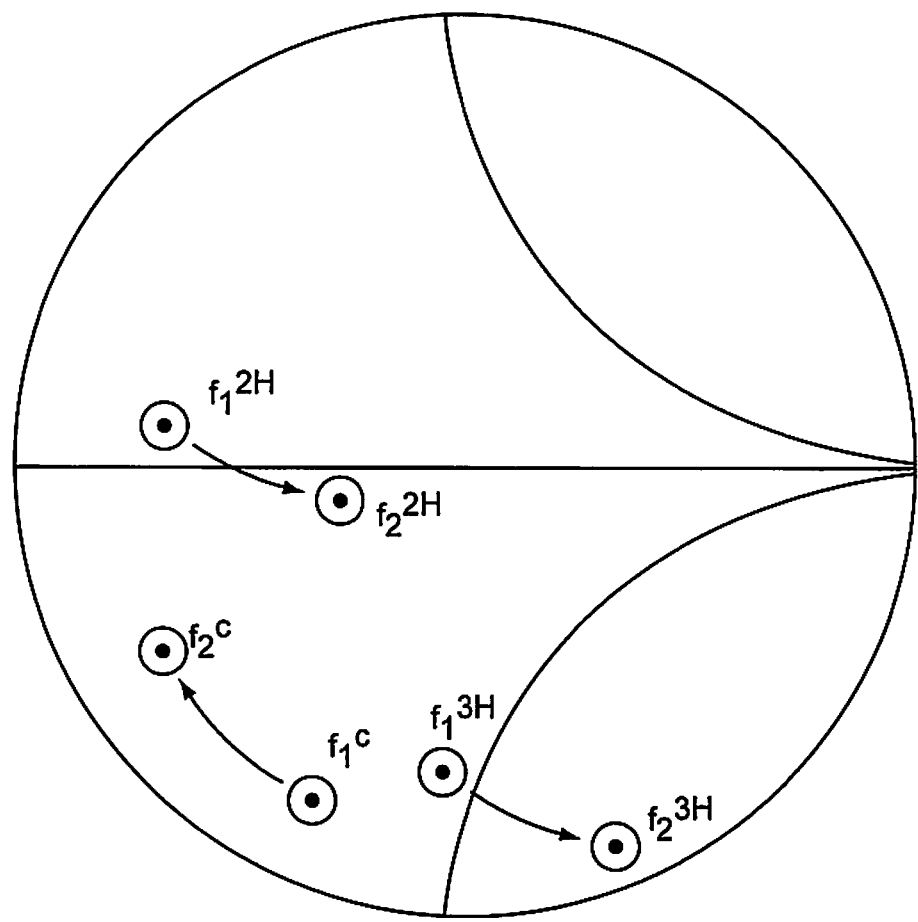
FIG. 8 is a Smith chart illustrating impedance points at various center frequencies and their associated harmonics, wherein the impedance points for the harmonics are ideally situated according to the concepts of the present disclosure.

The concepts of the present disclosure remedy the failings of existing designs, which only consider and control the impedances provided at the center frequency of the RF input signal $RF_{IN}$. In particular, the concepts of the present disclosure relate to dynamically adjusting, or modulating, the load impedances presented to the power amplifier circuitry 24 by specifically controlling the impedances that are provided at certain harmonics of the RF input signal $RF_{IN}$ in addition to controlling the impedances provided at the center frequency of the RF input signal $RF_{IN}$. The concept is illustrated below in association with the Smith chart of FIG. 8. In general, the circles represent acceptable impedance ranges, which were predetermined or characterized by the designer to meet performance specifications. The points represent the actual impedances provided by an output matching network 26. In particular, the Smith chart illustrates the ideal impedance ranges and actual impedance points before and after the RF input signal $RF_{IN}$ changes from a first center frequency $f_1^C$ to a second center frequency $f_2^C$ while other operating parameter conditions remain static. As depicted, the actual impedance (points) at the first center frequency $f_1^C$ and the second center frequency $f_2^C$ fall within the desired impedance ranges (circles), respectively. According to the concepts of the present disclosure, the actual impedances (points) at the second and third harmonics $f_1^{2H}$, $f_1^{3H}$ of the first center frequency $f_1^C$ fall within their desired impedance ranges (circles). The actual impedances (points) at the second and third harmonics $f_2^{2H}$, $f_2^{3H}$ of the second center frequency $f_2^C$ also fall within their desired impedance ranges (circles). Since each of the impedances at the respective center frequencies and associated harmonics fall within their desired ranges, overall performance is improved over systems where the impedances at the harmonics of the center frequencies are not considered and likely fall well outside of desired ranges.

Figure 9:
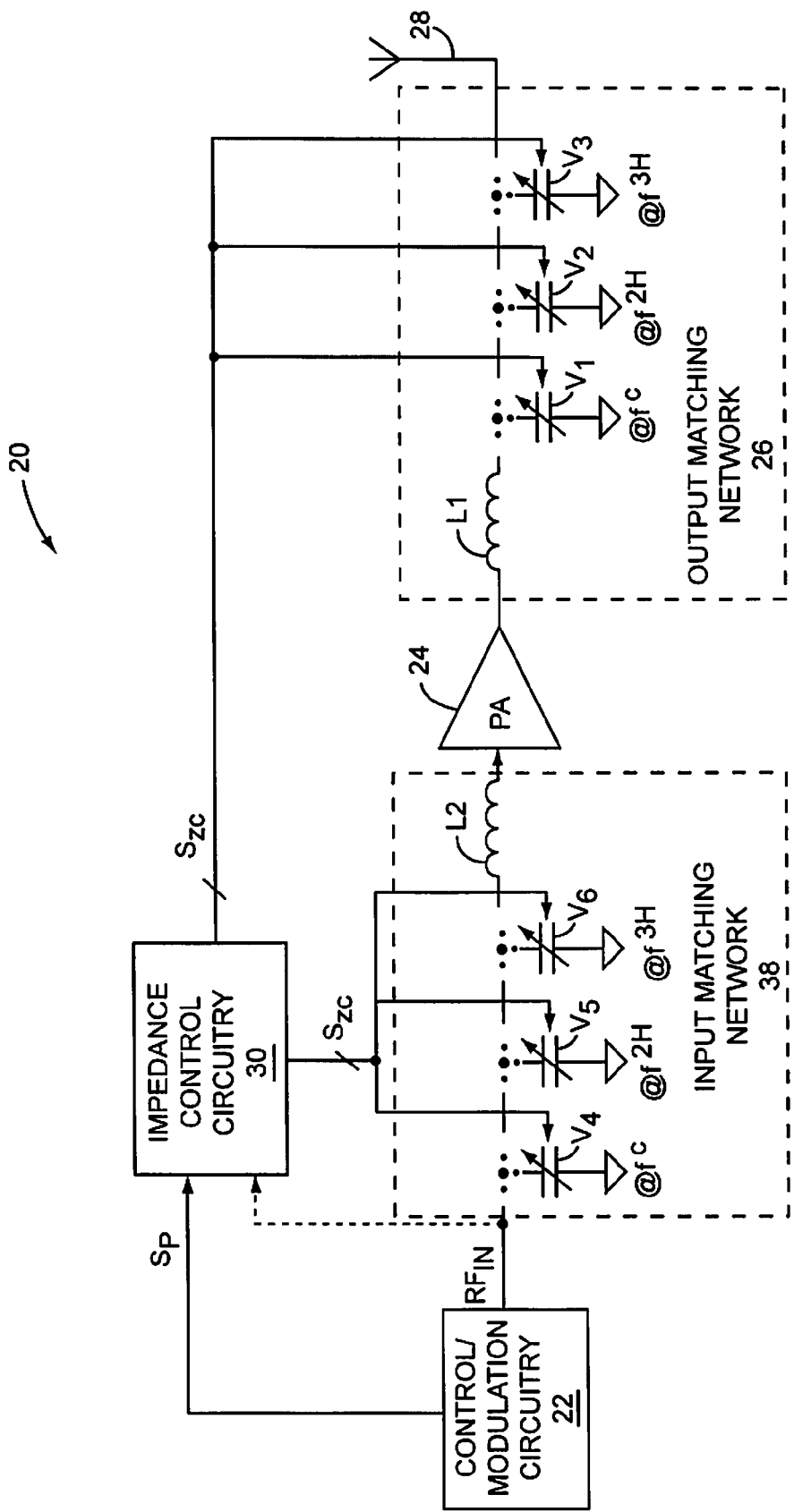
FIG. 9 illustrates transmission circuitry having input and output matching networks.

With reference to FIG. 9, another embodiment the disclosure provides an input matching network 38 at the source of the power amplifier circuitry 24. The input matching network 38 is configured and controlled in much the same manner as the output matching network 26. In particular, the input matching network 38 is a variable impedance network, which resides at the source of the power amplifier circuitry 24 and includes a number of static and variable impedance elements. As illustrated, a portion of the input matching network 38 is shown to include an inductor L2 and three varactors $V_4$, $V_5$, and $V_6$. The three varactors $V_4$, $V_5$, and $V_6$ are depicted to represent the input matching network's 38 ability to be dynamically tuned to present desired impedances for each of the center frequency and one or more harmonics of different RF input signals $RF_{IN}$. As illustrated, the input matching network 38 can be dynamically tuned to present desired impedances for each of the center frequency $f^C$, the second harmonic $f^{2H}$, and the third harmonic $f^{3H}$ of the current RF input signals $RF_{IN}$.

The varactors $V_4$, $V_5$, and $V_6$ are also controlled by the impedance control circuitry 30 using one or more impedance control signals $S_{ZC}$. In the illustrated embodiment, each of the varactors $V_4$, $V_5$, and $V_6$ receive a unique impedance control signal $S_{ZC}$. Again, the illustrated configuration of the input matching network 38 is provided merely to represent the concept of being able to set the desired impedances for each of the center frequency and one or more harmonics of different RF input signals $RF_{IN}$. As such, a given input matching network 38 may include any number of variable impedance elements, which are controlled by the impedance control circuitry 30.

As the center frequency of the RF input signals $RF_{IN}$ and the conditions of the operating parameters change, the respective impedances that are presented by the input matching network 38 at the center frequency and one or more harmonics of RF input signal $RF_{IN}$ may also need to change to maintain the given performance specification. As the center frequency of the RF input signal $RF_{IN}$ and conditions of the operating parameters change, the impedance control circuitry 30 dynamically adjusts the values of one or more of the variable impedance elements of the input matching network 38 in a desired fashion. The values of the variable impedance elements are adjusted such that the input matching network 38 substantially continuously presents the desired load impedances at the center frequency and at one or more harmonics of the RF input signal $RF_{IN}$ to achieve a given performance specification.

For the embodiment of FIG. 9, the impedance control circuitry 30 is configured to substantially continuously determine the relative values at which to set the variable impedance elements of the input and output matching networks 38, 26 in light of the current center frequency of the RF input signal $RF_{IN}$ and the conditions of the operating parameters. The current center frequency of the RF input signal $RF_{IN}$ and condition of the operating parameters may be provided by the control and modulation circuitry 22 via a parameter signal $S_P$, which may specifically identify one or more of the current center frequency of the RF input signal $RF_{IN}$ and the operating parameter conditions. Again, the processing circuitry 32 may also dynamically monitor the RF input signal $RF_{IN}$ to detect certain operating parameter conditions, such as the center frequency, amplitude, or phase of the RF input signal $RF_{IN}$.

Once the current center frequency, the RF input signal $RF_{IN}$, and the operating parameter conditions are obtained, the processing circuitry 32 determines the relative values at which to set the variable impedance elements of the input and output matching networks 38, 26 in light of the current center frequency and the operating parameter conditions. For the embodiment of FIG. 9, the control data for each entry in the lookup table 34 corresponds to a specific center frequency and a specific combination of operating parameter conditions. The control data includes information sufficient to set the capacitance value of each of the three varactors $V_1$, $V_2$, and $V_3$ in the output matching network 26 as well as each of the three varactors $V_4$, $V_5$, and $V_6$ in the input matching network 38 to the values deemed best suited for the corresponding center frequency and operating parameter conditions. The control data for each of the six varactors $V_1$ through $V_6$ is sent to corresponding channels of the DAC 36, which will generate corresponding analog impedance control signals $S_{ZC}$ to set the capacitance values of the respective varactors $V_1$ through $V_6$. As such, the capacitance values of the varactors $V_1$, $V_2$, and $V_3$ of the output matching network 26 and $V_4$, $V_5$, and $V_6$ of the input matching network 38 are set based on the current center frequency and operating parameter conditions. This process is substantially continuously repeated wherein the values of the variable impedance elements in the input and output matching networks 38, 26 are effectively modulated such that the power amplifier circuitry 24 is continuously presented with desired impedances at the center frequency and one or more harmonics of the RF input signal $RF_{IN}$.

Notably, the input and output matching networks 38, 26 will generally be different and will play different roles in achieving the given performance specification. Accordingly, the impedances presented at any given time at the source and load of the power amplifier circuitry 24 will likely differ at the center frequency and the various harmonics of the RF input signal $RF_{IN}$. In one configuration, the impedances presented to the source of the power amplifier circuitry 24 at each of the available center frequencies of the RF input signal $RF_{IN}$ are configured to pass the center frequency of the RF input signal $RF_{IN}$. In contrast, the impedances at each of the second and third harmonics for each of the available center frequencies are configured to reflect the respective harmonics, which are fed back from the output, back toward the power amplifier circuitry 24. Again, the second and third harmonics may be reflected or otherwise manipulated at particular phases to optimize efficiency. The particular phases will vary based on implementation.

Figure 10:
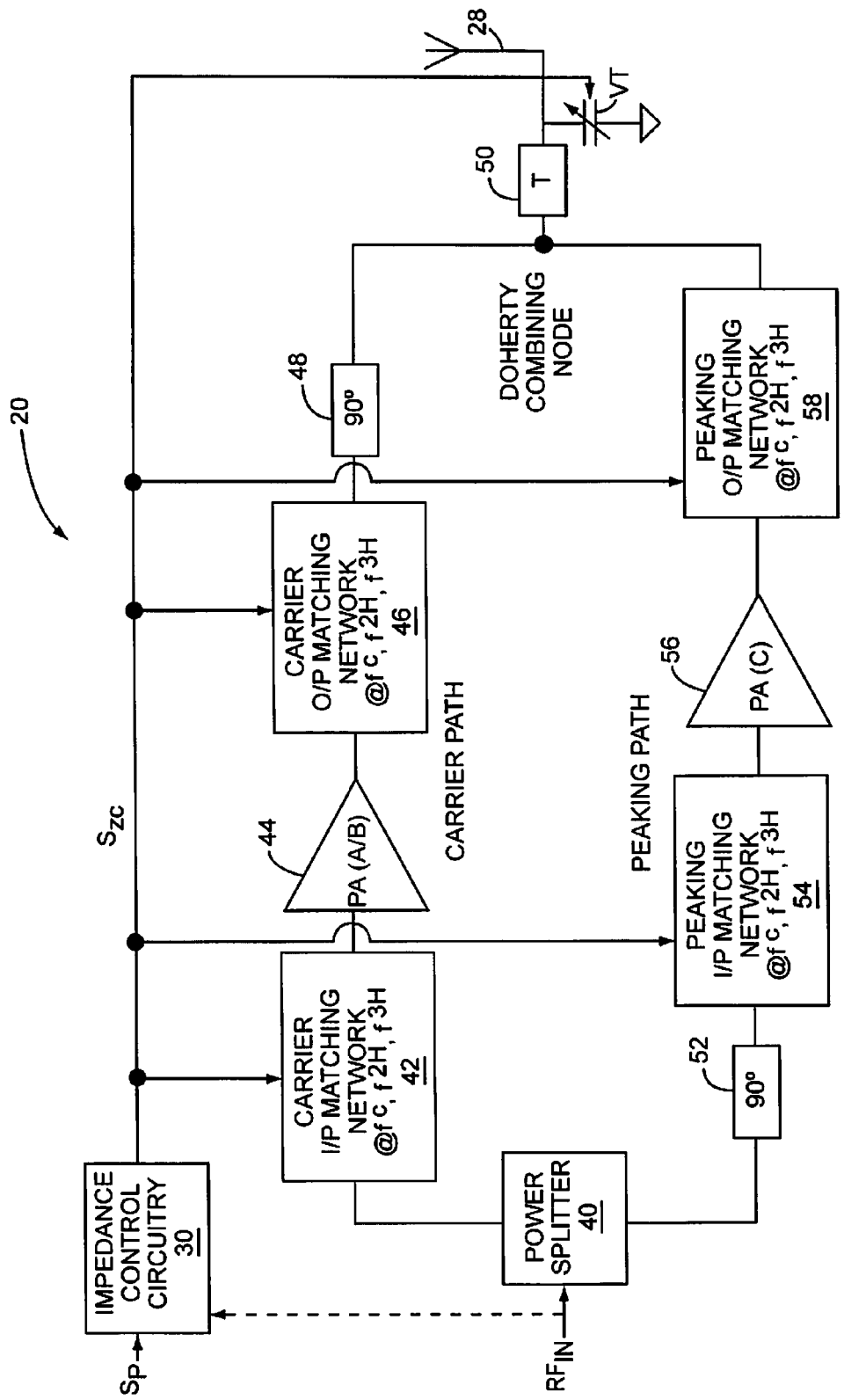
FIG. 10 illustrates transmission circuitry that incorporates a Doherty amplifier configuration, wherein each amplifier path includes input and output matching networks.

Providing and controlling variable input and output matching networks 38, 26 as described above are beneficial with virtually any type of power amplifier design. For single path amplifier designs, the variable input and output matching networks 38, 26 may be placed before and after the power amplifier circuitry 24. For parallel path amplifier designs, such as those employing a Doherty amplifier configuration, input and output matching networks 38, 26 may be provided before and after the power amplifier circuitry 24 in each of the parallel paths. A Doherty amplifier configuration that employs the concepts of the present disclosure is described below in association with FIG. 10.

As illustrated, the RF input signal $RF_{IN}$ is fed to a power splitter 40, such as a quadrature coupler, which splits the RF input signal $RF_{IN}$ along a "carrier path" and a "peaking path." The carrier path includes a carrier input matching network 42, carrier power amplifier circuitry 44, a carrier output matching network 46, and a 90° phase shift element 48, such as a transmission line, and terminates at a Doherty combining node. The Doherty combining node is coupled to a transformer 50, which is coupled to the antenna 28. The peaking path includes a 90° phase shift element 52, a peaking input matching network 54, peaking power amplifier circuitry 56, and a peaking output matching network 58, and terminates into the Doherty combining node.

In traditional Doherty fashion, the carrier power amplifier circuitry 44 provides a class AB (or B) amplifier, and the peaking power amplifier circuitry 56 provides a class C amplifier. During periods where the level of the RF input signal $RF_{IN}$ is below a given threshold, the class AB amplifier of the carrier power amplifier circuitry 44 efficiently amplifies the portion of the RF input signal $RF_{IN}$ that flows along the carrier path. When the RF input signal $RF_{IN}$ is below a given threshold, the class C amplifier of the peaking power amplifier circuitry 56 is turned off and consumes little power. During periods where the RF input signal $RF_{IN}$ is above the given threshold, the class AB amplifier of the carrier power amplifier circuitry 44 delivers its maximum power when amplifying the portion of the RF input signal $RF_{IN}$ flowing along the carrier path. When the RF input signal $RF_{IN}$ is below a given threshold, the class C amplifier of the peaking power amplifier circuitry 56 turns on and delivers up to its maximum power when amplifying the portion of the RF input signal $RF_{IN}$ that flows along the peaking path. By employing the 90° phase shift elements 48 and 52, the amplified signals from the carrier and peaking paths reach the Doherty combining node in phase and are reactively combined and then stepped up via the transformer 50 before being delivered to the antenna 28 for transmission. With a Doherty configuration, power-added efficiency is significantly improved at backed-off power levels compared to single path or other balanced amplifiers.

While Doherty amplifiers are efficient, the concepts of the disclosure can further increase the efficiency of a traditional Doherty amplifier by as much as 50%. With continued reference to FIG. 10, the carrier input and output matching networks 42, 46 are provided at the source and load of the carrier power amplifier circuitry 44 along the carrier path. The peaking input and output matching networks 54, 58 are provided at the source and load of the peaking power amplifier circuitry 56 along the peaking path. The carrier and peaking input matching networks 42, 54 are configured and controlled in the same manner as the above described input matching network 38. Similarly, the carrier and peaking output matching networks 46, 58 are configured and controlled in the same manner as the above described output matching network 26. Each of these matching networks 42, 46, 54, 58 may include static and variable impedance elements, the values of which are dynamically controlled by the impedance control circuitry 30 via the impedance control signals $S_{ZC}$.

As the center frequency of the RF input signal $RF_{IN}$ and the conditions of the operating parameters change, the respective impedances that are presented by these matching networks 42, 46, 54, 58 at the center frequency and one or more harmonics of the RF input signal $RF_{IN}$ may also need to change to maintain the given performance specification. As the center frequency of the RF input signal $RF_{IN}$ and conditions of the operating parameters change, the impedance control circuitry 30 dynamically adjusts the values of the variable impedance elements of the matching networks 42, 46, 54, 58 in a desired fashion. The values of the variable impedance elements are adjusted such that the matching networks 42, 46, 54, 58 substantially continuously present the desired load impedances at the center frequency and at one or more harmonics of the RF input signal $RF_{IN}$ to achieve a given performance specification.

In addition to controlling the values of the variable impedance elements in the matching networks 42, 46, 54, 58, the impedance control circuitry 30 may also be configured to control variable impedance elements associated with the transformer 50. In some instances, dynamically varying the effective impedance of the transformer 50 based on certain operating parameter conditions may further enhance the performance of the transmission circuitry 20. In the illustrated embodiment, a shunt varactor $V_T$ is provided at the output of the transformer 50 to provide a means for varying the impedance associated with the transformer 50 at various frequencies.

Figure 11:
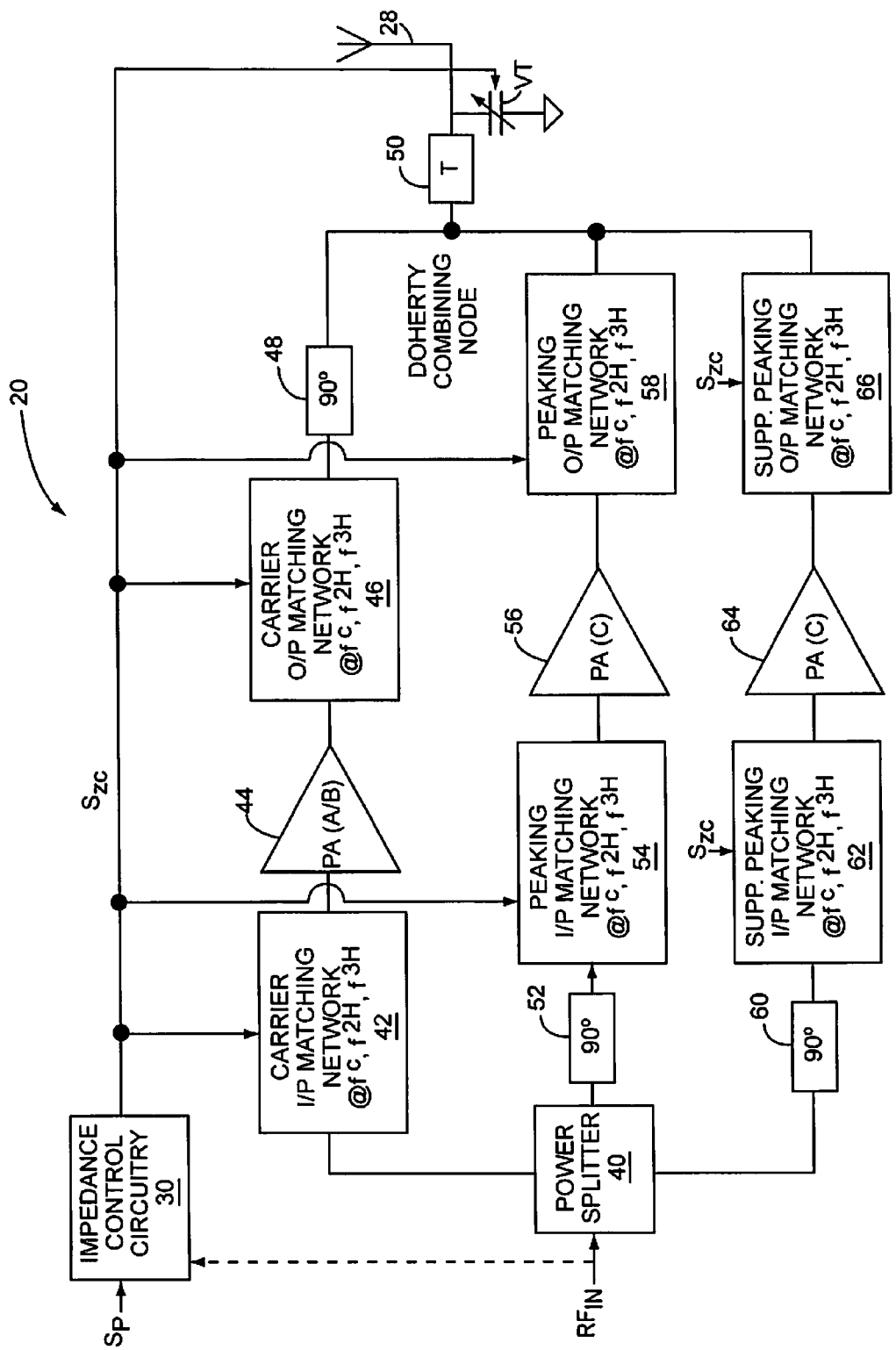
FIG. 11 illustrates transmission circuitry that incorporates an enhanced Doherty amplifier configuration, wherein each amplifier path includes input and output matching networks.

These above concepts can be extended to any number of parallel amplifier paths. For example, FIG. 11 illustrates a modified Doherty configuration that includes three paths: the carrier path, the peaking path, and a supplemental peaking path. The carrier and peaking paths are provided in much the same fashion as described in association with FIG. 10. The supplemental peaking path includes a 90° phase shift element 60, a supplemental peaking input matching network 62, supplemental peaking power amplifier circuitry 64, and a supplemental peaking output matching network 66, and terminates into the Doherty combining node.

The supplemental peaking power amplifier circuitry 64 provides a class C amplifier. During periods where the level of the RF input signal $RF_{IN}$ is below a first threshold, the class AB amplifier of the carrier power amplifier circuitry 44 efficiently amplifies the portion of the RF input signal $RF_{IN}$ that flows along the carrier path. When the RF input signal $RF_{IN}$ is below the first threshold, the class C amplifiers of the peaking power amplifier circuitry 56 and the supplemental peaking power amplifier circuitry 64 are turned off and consume little power. During periods where the RF input signal $RF_{IN}$ is above the first threshold and below a second threshold, the class AB amplifier of the carrier power amplifier circuitry 44 delivers its maximum power when amplifying the portion of the RF input signal $RF_{IN}$, which flows along the carrier path. The class C amplifier of the peaking power amplifier circuitry 56 turns on and delivers up to its maximum power, when amplifying the portion of the RF input signal $RF_{IN}$ that flows along the peaking path. The class C amplifier of the supplemental peaking power amplifier circuitry 64 remains off. During periods where the RF input signal $RF_{IN}$ is above the second threshold, the class AB amplifier of the carrier power amplifier circuitry 44 and the class C amplifier of the peaking power amplifier circuitry 56 deliver maximum power. Additionally, the class C amplifier of the supplemental peaking power amplifier circuitry 64 turns on and delivers up to its maximum power, when amplifying the portion of the RF input signal $RF_{IN}$ that flows along the supplemental peaking path.

The amplified signals from the carrier, peaking, and supplemental peaking paths reach the Doherty combining node in phase and are reactively combined and stepped up via the transformer 50 before being delivered to the antenna 28 for transmission. With this Doherty configuration, power-added efficiency is further improved at backed-off power levels compared to a traditional Doherty configuration. Further, the supplemental peaking input matching network 62 and the supplemental peaking output matching network 66 are configured and dynamically controlled in essentially the same manner as the peaking input matching network 54 and the peaking output matching network 58.

Figure 12:
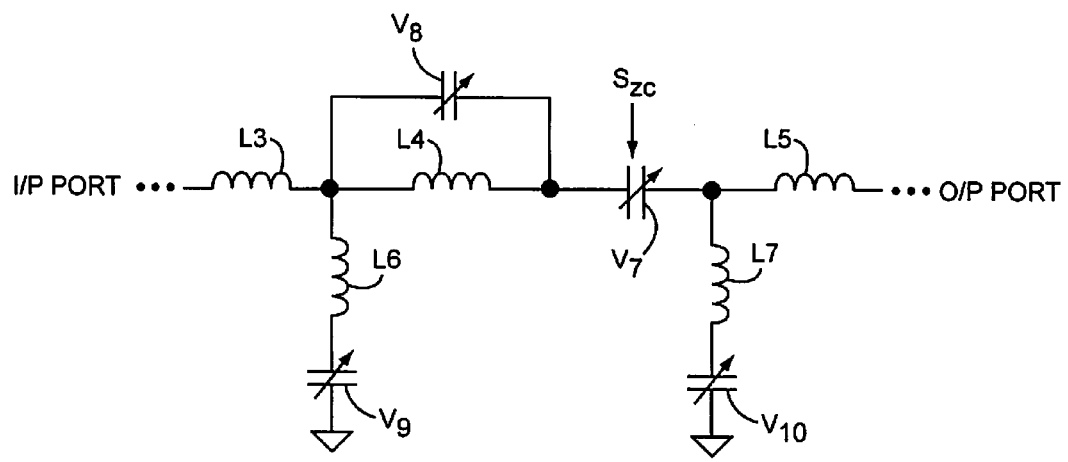
FIG. 12 illustrates a lumped element impedance network for an input or output matching network.

With reference to FIG. 12, a lumped element network is illustrated. Any of the input or output matching networks described above may be formed at least in part by the lumped element network of FIG. 12 or a variant thereof. A lumped element network is generally characterized by the use of passive components. The illustrated network includes series inductors L3, L4, and L5; shunt inductors L6 and L7; series varactor $V_7$, bypass series varactor $V_8$, and shunt varactors $V_9$ and $V_{10}$. Each of the varactors $V_7$ through $V_{10}$ are shown being controlled by the impedance control signal of the impedance control circuitry 30. Those skilled in the art will recognize the near limitless number of lumped element network configurations and the fact that the lumped element network could contain any number of static and variable resistors, inductors, and capacitors. The illustrated example simply depicts one exemplary configuration of all or a portion of a variable impedance network of an input or output matching network.

Figure 13:
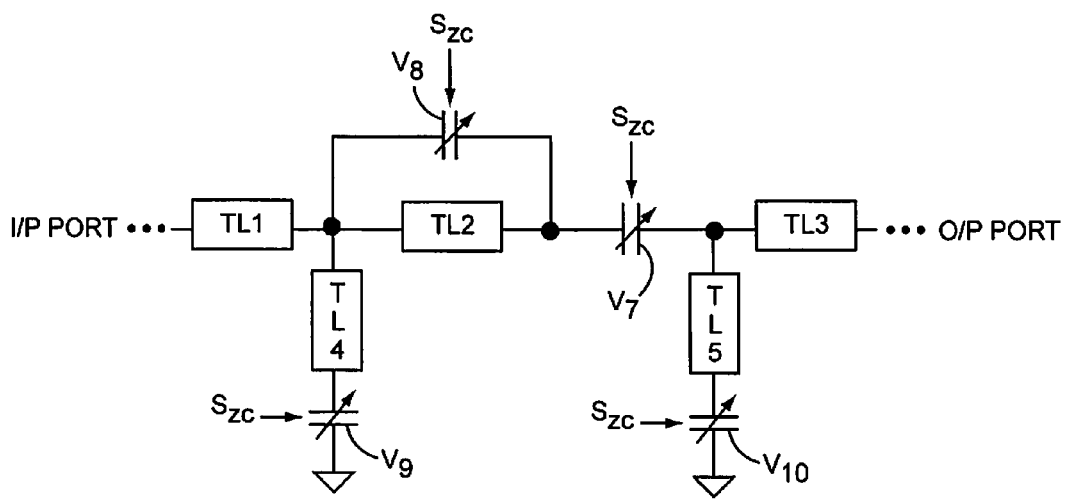
FIG. 13 illustrates a distributed impedance network for an input or output matching network.

FIG. 13 illustrates an implementation of the lumped element impedance network of FIG. 12 as a distributed network. A distributed impedance network is generally characterized by the use of transmission lines. In the illustrated example, the inductors L3 through L7 are replaced with transmission lines TL1 through TL5, which provide inductances equivalent to the inductors L3 through L7.

Figure 14:
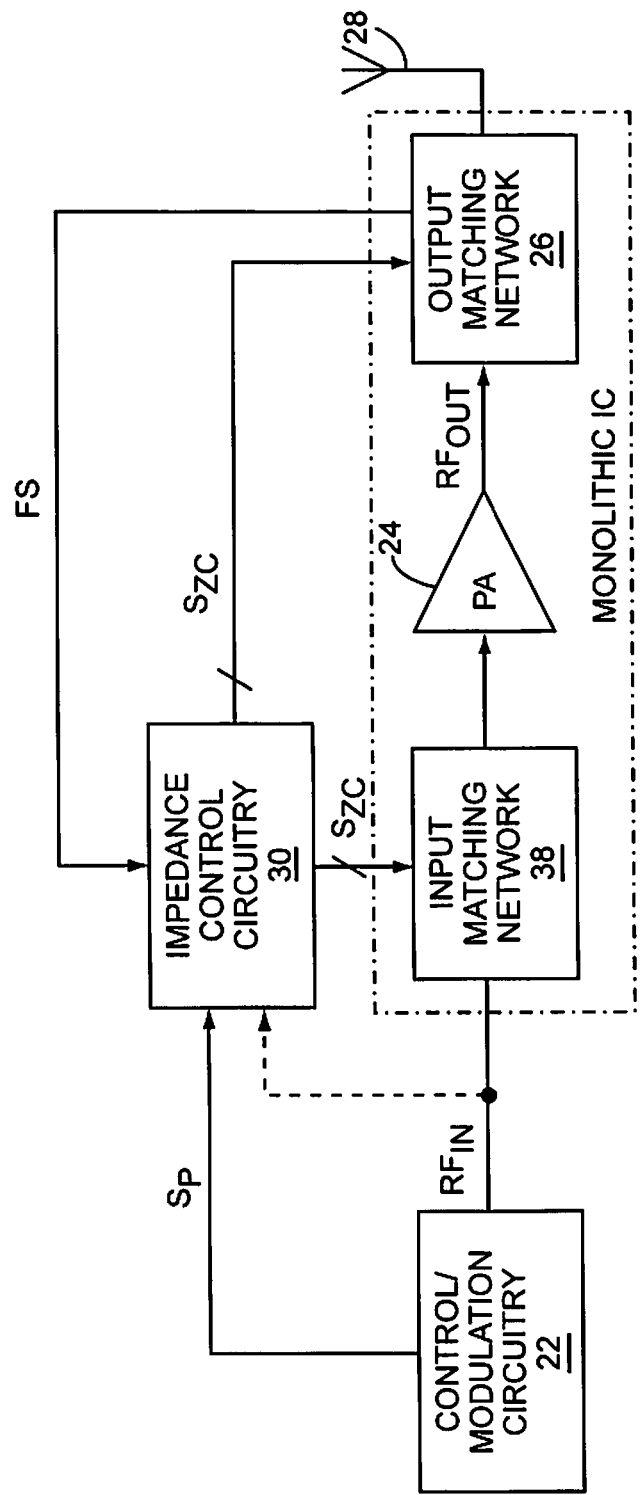
FIG. 14 illustrates transmission circuitry wherein the amplifier circuitry and the input and output matching networks are provided on a monolithic integrated circuit.

In one embodiment of the disclosure, at least the input matching network 38, the output matching network 26, and the power amplifier circuitry 24 are formed on the same microwave monolithic integrated circuit, as illustrated in FIG. 14. As depicted, the input matching network 38, the output matching network 26, and the power amplifier circuitry 24 may all be formed on the same gallium nitride (GaN) semiconductor die and the remaining control and processing circuitry, such as the control and modulation circuitry 22 and the impedance control circuitry 30, may be formed on one silicon (Si) semiconductor die or distributed across multiple silicon semiconductor dies. In one embodiment, the impedance control circuitry 30 is implemented in a field programmable gate array (FPGA). While the gallium nitride and silicon materials systems are used as examples, other material systems, such as gallium arsenide (GaAs), silicon germanium (SiGe), and the like may be used to form the various parts of the transmission circuitry 20.

In certain cases, particularly where the average output power is in the range of ten (10) watts, employing monolithic microwave integrated circuit (MMIC) solutions have proven to be very beneficial. In particular, the introduction of phase delays associated with a non-monolithic solution may impact correction resolution and accuracy of the presented impedances, thereby adversely affecting instantaneous bandwidth and other performance metrics. Further, the use of a GaN material system to form the MMIC has proven to even further enhance the resolution and accuracy of the system.

In such solutions, single or multi-stage single-ended amplifiers or Doherty amplifier arrangements can be integrated within a single integrated circuit or die. Harmonic terminations, both on the input and output of the power amplifier circuitry 24, become highly controllable and can be positioned electrically close to the transistors that form the power amplifier circuitry 24. The reproducibility of power amplifier performance as well as the ease of manufacturing and high yields of a MMIC solution can be superior to hybrid approaches employing either bare transistor die or other chip components or packaged transistors with printed circuit board matching.

An additional benefit is the reduction in size of MMIC solutions compared to hybrid circuits such that a number of "low average power" integrated circuits can be combined to support applications where higher average power is required. Thus, a single MMIC incorporating transistors, varactors, and other passive components can be used singly for "low power" (distributed architectures, picocell, or phased array) applications and a number of combined MMICs for "high power" (fixed tower and micro/macrocell) applications.

Also illustrated in FIG. 14, feedback may be employed from or about the output matching network 26 to the impedance control circuitry 30 via a feedback signal FS. In particular, "sniffing" circuitry may be employed in association with the output matching network 26 or in the impedance control circuitry 30 to allow the impedance control circuitry 30 to monitor the RF output signal $RF_{OUT}$ to ensure that the output matching network 26 is performing as desired. As such, the values of the variable impedance elements of the output matching network 26 may be fine tuned to ensure appropriate impedances are being provided at the appropriate center and harmonic frequencies of the RF output signal $RF_{OUT}$ and the RF input signal $RF_{IN}$.

Figure 15:
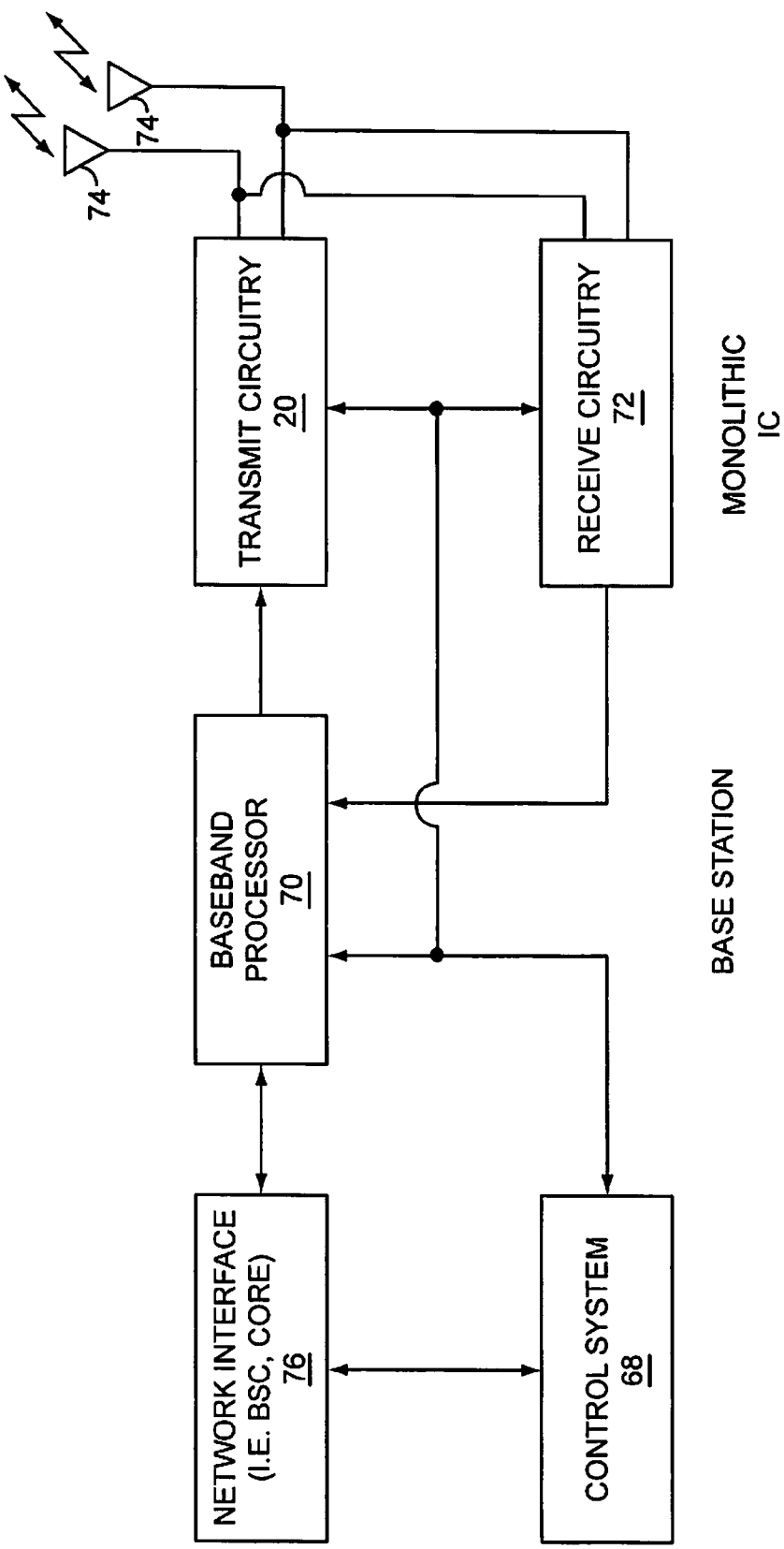
FIG. 15 illustrates a base station or like access point that supports wireless communications.

With reference to FIG. 15, a base station configured according to one embodiment of the disclosure is illustrated. The base station may act as any wireless access point that supports wireless communications and may support any type of wireless communication technology, such as traditional cellular technologies employing OFDMA, CDMA, and TDMA, and local wireless technologies. The base station generally includes a control system 68, a baseband processor 70, transmission circuitry 20, such as that described above, receive circuitry 72, one more antennas 74, and a network interface 76. The control system 68 will have memory for storing the requisite software and data required for operation. In one embodiment, the control system 68 is implemented in a FPGA. The receive circuitry 72 receives radio frequency signals bearing information from one or more remote transmitters of mobile devices. Preferably, a low noise amplifier and a filter (not shown) cooperate to amplify and remove broadband interference from the signal for processing. Downconversion and digitization circuitry (not shown) will then downconvert the filtered, received signal to an intermediate or baseband frequency signal, which is then digitized into one or more digital streams.

The baseband processor 70 processes the digitized received signal to extract the information or data bits conveyed in the received signal. This processing typically comprises demodulation, decoding, and error correction operations. As such, the baseband processor 70 is generally implemented in one or more digital signal processors (DSPs). The received information is then sent toward the core network via the network interface 76 or transmitted toward another mobile device serviced by the base station. The network interface 76 will typically interact with the core network via a base station controller (not shown).

On the transmit side, the baseband processor 70 receives digitized data, which may represent voice, data, or control information, from the network interface 76 under the control of the control system 68. In one embodiment, the control system 68 is implemented in a FPGA. The baseband processor 70 encodes the data for transmission. The encoded data is output to the transmission circuitry 20, where it is used by a modulator to modulate a carrier signal that is at a desired transmit frequency or frequencies. The power amplifier circuitry 24 (FIG. 7) will amplify the modulated carrier signal to a level appropriate for transmission, and deliver the modulated carrier signal to one or more of the antennas 74 through the output matching network 26 (FIG. 7).

Figure 16:
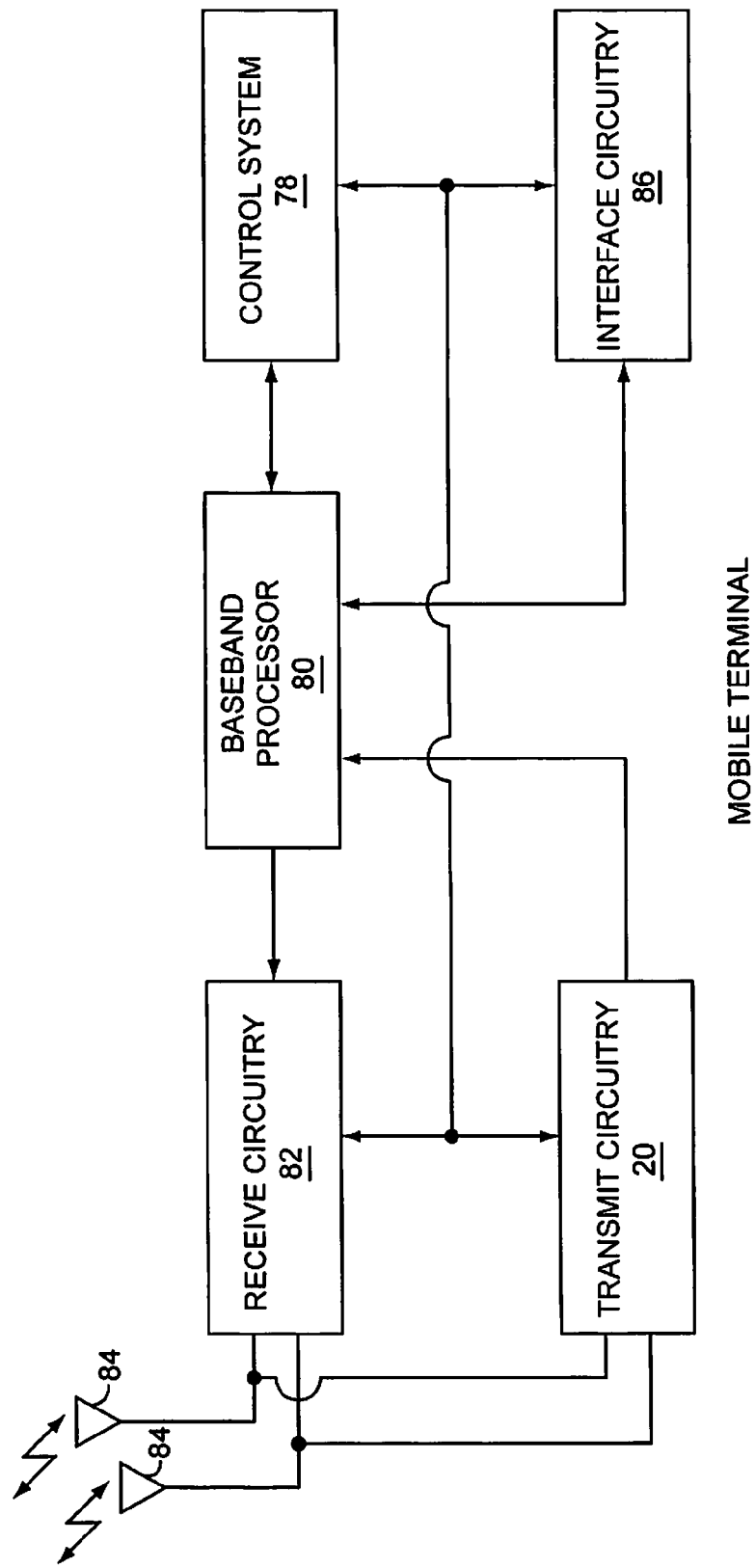
FIG. 16 illustrates a mobile device that supports wireless communications.

With reference to FIG. 16, a mobile device configured according to one embodiment of the disclosure is illustrated. The mobile device will support a communication technology that is compatible with various types of base stations. The mobile device will include a control system 78, a baseband processor 80, transmission circuitry 20, such as that described above, receive circuitry 82, one or more antennas 84, and interface circuitry 86. The control system 78 will have memory for storing the requisite software and data required for operation. The receive circuitry 82 receives radio frequency signals bearing information from one or more remote transmitters provided by base stations. Preferably, a low noise amplifier and a filter (not shown) cooperate to amplify and remove broadband interference from the signal for processing. Downconversion and digitization circuitry (not shown) will then downconvert the filtered, received signal to an intermediate or baseband frequency signal, which is then digitized into one or more digital streams. The baseband processor 80 processes the digitized received signal to extract the information or data bits conveyed in the received signal. This processing typically comprises demodulation, decoding, and error correction operations. The baseband processor 80 is generally implemented in one or more DSPs.

For transmission, the baseband processor 80 receives digitized data, which may represent voice, data, media, or control information, from the control system 78, which the baseband processor 80 encodes for transmission. The encoded data is output to the transmission circuitry 20, where it is used by a modulator to modulate a carrier signal that is at a desired transmit frequency or frequencies. The power amplifier circuitry 24 (FIG. 7) will amplify the modulated carrier signal to a level appropriate for transmission, and deliver the modulated carrier signal to the one or more antennas 84 through a matching network.

Those skilled in the art will recognize improvements and modifications to the embodiments of the present disclosure. All such improvements and modifications are considered within the scope of the concepts disclosed herein and the claims that follow.

What is claimed is:

1. Transmission circuitry comprising:
    power amplifier circuitry that comprises an input and an output and is configured to amplify a radio frequency (RF) input signal, which includes data that has been modulated for transmission;
    an input matching network coupled to the input of the power amplifier circuitry and comprising a first plurality of variable impedance elements, wherein values of the first plurality of variable impedance elements are controlled by at least one impedance control signal; and
    impedance control circuitry configured to generate the at least one impedance control signal to dynamically control the values of the first plurality of variable impedance elements based on a center frequency of the RF input signal and at least one operating parameter condition such that the input matching network substantially continuously provides a desired source impedance at the center frequency of the RF input signal and a desired source impedance at one or more harmonics of the RF input signal as the center frequency of the RF input signal and the at least one operating parameter condition change during operation.

2. The transmission circuitry of claim 1 wherein the power amplifier circuitry and the input matching network are formed on a single monolithic integrated circuit.

3. The transmission circuitry of claim 1 wherein, for various combinations of available frequencies of the center frequency of the RF input signal and available states of the at least one operating parameter condition, corresponding values for the desired source impedance at the center frequency of the RF input signal and the desired source impedance at the one or more harmonics of the RF input signal are characterized in advance of operation to achieve a given performance specification.

* * * * *